(12) United States Patent
Lu et al.

(10) Patent No.: US 8,302,287 B2
(45) Date of Patent: Nov. 6, 2012

(54) METHOD OF MANUFACTURING A MULTILAYER INDUCTOR

(75) Inventors: Jun Lu, San Jose, CA (US); François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/891,105

(22) Filed: Sep. 27, 2010

(65) Prior Publication Data

US 2011/0012701 A1     Jan. 20, 2011

Related U.S. Application Data

(62) Division of application No. 12/315,703, filed on Dec. 8, 2008, now Pat. No. 7,843,303.

(51) Int. Cl.
*H01F 7/06* (2006.01)

(52) U.S. Cl. ........... 29/606; 29/602.1; 29/604; 336/110; 336/175; 336/178; 336/184; 363/17; 363/48; 363/58

(58) Field of Classification Search ............... 29/602.1, 29/604–607, 840; 336/110, 175, 178, 184, 336/200, 214, 215, 234; 363/17, 48, 58
See application file for complete search history.

(56) References Cited

U.S. PATENT DOCUMENTS

| | | | | |
|---|---|---|---|---|
| 5,515,022 A | * | 5/1996 | Tashiro et al. | 336/200 |
| 6,073,339 A | * | 6/2000 | Levin | 29/606 |
| 6,223,422 B1 | * | 5/2001 | Takeuchi et al. | 29/607 |
| 6,483,414 B2 | * | 11/2002 | Takeuchi et al. | 336/200 |
| 6,965,161 B2 | * | 11/2005 | Jun et al. | 257/700 |
| 7,820,097 B2 | * | 10/2010 | Schroder et al. | 419/45 |

* cited by examiner

*Primary Examiner* — Paul D Kim
(74) *Attorney, Agent, or Firm* — Jingming Cai; Schein & Cai LLP

(57) ABSTRACT

A multilayer inductor includes a bottom magnetic layer having an external conductive pattern formed on a bottom surface thereof for connection to a substrate such as a printed circuit board. The bottom external conductive pattern includes signal/power contacts and first and second inductor electrodes. A top magnetic layer includes a top external conductive pattern having signal/power contacts and inductor electrode contacts. An inductor conductive pattern formed on the top surfaces of intermediate magnetic layers disposed between the top and bottom magnetic layers are electrically coupled to each other by means of through holes to form a spiral inductor element.

7 Claims, 11 Drawing Sheets

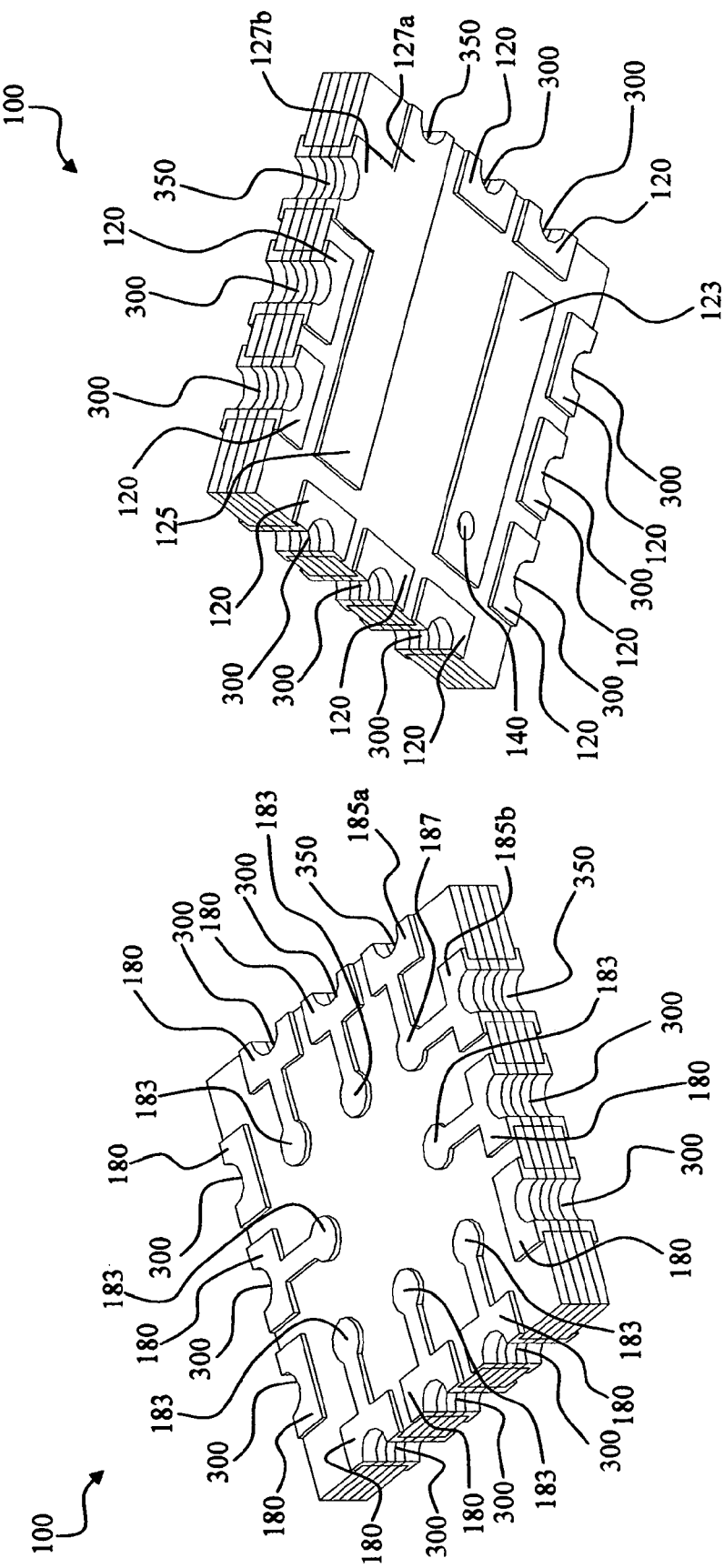

METHOD OF MANUFACTURING A MULTILAYER INDUCTOR

The instant patent application is a divisional patent application of, and claims priority to, U.S. patent application Ser. No. 12/315,703 filed on Dec. 8, 2008, now U.S. Pat. No. 7,843,303, to Jun Lu et al., which is herein incorporated by reference in its entirety.

BACKGROUND OF THE INVENTION

1. Field of the Invention

The present invention generally relates to multilayer inductors and more particularly to a multilayer inductor adapted to accommodate a flip chip on a top surface thereof and having conductive patterns formed on its top, bottom and side surfaces.

2. Description of Related Art

Multilayer inductors are well known in the art. For example a chip-type inductor comprising a laminated structure is disclosed in U.S. Pat. No. 4,543,553. The structure includes a plurality of magnetic layers in which linear conductive patterns extending between the respective magnetic layers are connected successively in a form similar to a coil so as to produce an inductance component. The conductive patterns formed on the upper surfaces of the magnetic layers and the conductive patterns formed on the lower surfaces of the magnetic layers are connected with each other in the interfaces of the magnetic layers and are also connected to each other via through-holes formed in the magnetic layers so that the conductive patterns are continuously connected in a form similar to a coil.

U.S. Pat. No. 5,032,815 discloses a lamination type inductor having a plurality of ferrite sheets assembled one above the other and laminated together, the uppermost and lowermost sheets being end sheets having lead-out conductor patterns thereon and conductor patterns on the surfaces of the end sheets which face each other which are connected to the lead-out conductor patterns and which are for connection to conductor patterns on intermediate sheets, and a plurality of intermediate ferrite sheets, each having a conductor pattern on one surface thereof which corresponds to a 0.25 turn of an inductor coil and a conductor pattern on the other surface which corresponds to a 0.5 turn of an inductor coil, each ferrite sheet having an opening therethrough through which the conductor patterns of the 0.25 and 0.5 turn are electrically connected to form a 0.75 turn of an inductor coil on each ferrite sheet. The conductor patterns on the successive intermediate sheets are connected to each other for forming an inductor coil having a number of turns which is a multiple of 0.75, and the conductor patterns on the upper surface of the uppermost of the plurality of intermediate ferrite sheets and the lower surface of the lowermost of the intermediate ferrite sheets are electrically connected to the conductor patterns on the surfaces of the end sheets which face each other for forming with the last-mentioned conductor pattern a complete inductor coil.

U.S. Pat. No. 6,630,881 discloses a method for producing a multi-layered chip inductor that includes the steps of: forming coil-shaped internal conductors inside a green ceramic laminate, each of which coil-shaped internal conductors is spiraled around an axial line in the laminating direction of the green ceramic laminate; applying an external electrode paste onto at least one laminating-direction surface of the green ceramic laminate, which external electrode paste connects to an end of the coil-shaped internal conductor; cutting the green ceramic laminate along the laminating direction into chip-shaped-green ceramic laminates each having the coil-shaped internal conductor inside; and firing each of the chip-shaped green ceramic laminates and baking the external electrode paste to form an external electrode.

Another laminated inductor is disclosed in U.S. Pat. No. 7,046,114. The laminated inductor includes ceramic sheets provided with spiral coil conductor patterns of one turn, ceramic sheets provided with spiral coil conductor patterns of two turns, and ceramic sheets provided with lead-out conductor patterns, which are laminated together. The coil conductor patterns are successively electrically connected in series in regular order through via holes. The via holes are disposed at fixed locations in the ceramic sheets.

U.S. Pat. No. 6,930,584 discloses a microminiature power converter including a semiconductor substrate on which is formed a semiconductor integrated circuit, a thin film magnetic induction element, and a capacitor. The thin film magnetic induction element includes a magnetic insulating substrate, and a solenoid coil conductor in which a first conductor is formed on a first principal plane of the magnetic insulating substrate, a second conductor is formed on a second principal plane of the magnetic insulating substrate, and a connection conductor is formed in a through hole passing through the entire magnetic insulating substrate. The disclosed power converter suffers the disadvantage that plating the deep through hole is difficult and expensive.

U.S. Published Patent Application No. 2006/0227518 discloses a thin film magnetic induction element including a ferrite substrate, a coil provided across the ferrite substrate and including connection conductors and coil conductors, and terminals provided on perimeter portions of the substrate. Terminals capable of being adversely affected by an induced magnetic flux, such as a VDD terminal, a CGND terminal, an IN terminal, a PVDD terminal, a PGND terminal, an FB terminal, a CE terminal, and an AL terminal are arranged along the Y-direction of the substrate, in which the magnetic flux density is low. Terminals substantially incapable of being adversely affected by an induced magnetic flux are arranged along the X-direction of the substrate, in which the magnetic flux density is high. A micro electric power converter having the thin film magnetic induction element is less susceptible to circuit malfunction.

Although it is possible to surface mount a flip chip on top of the inductors disclosed by the above U.S. Pat. No. 6,930,584 and U.S. Published Patent Application No. 2006/0227518, the deposition of conductive layers, for example Cu/Ni layers on top, bottom and side walls of the inductor requires special thick metal deposition technology which is difficult and costly and makes the final product less competitive. Furthermore, the disclosed inductors are single layer inductors, not multilayer inductors.

In view of the foregoing, there is a need for a cost-effective multilayer inductor adapted to accommodate a flip chip on a top surface thereof and having conductive patterns formed on its top, bottom and side surfaces. Further objects and advantages of the present invention will be apparent from the following detailed description of the invention and associated drawings.

SUMMARY OF THE INVENTION

The multilayer inductor of the invention overcomes the disadvantages of the prior art and achieves the objectives of the invention by providing a multilayer inductor comprising a plurality of magnetic layers laminated together. In a first embodiment, a bottom magnetic layer includes an external conductive pattern formed on a bottom surface thereof for connection to a substrate such as a printed circuit board. The bottom external conductive pattern includes signal/power contacts and first and second inductor electrodes. A top magnetic layer includes an external conductive pattern having signal/power contacts, and an inductor electrode contact. An inductor conductive pattern formed on the top surface of the bottom magnetic layer and inductor conductive patterns formed on the top surfaces of intermediate magnetic layers disposed between the top and bottom magnetic layers are electrically coupled to each other by means of through holes to form a spiral inductor element. The spiral inductor element is coupled to the first inductor electrode by means of a through hole formed in the bottom magnetic layer and to the second inductor electrode by means of power conductive traces formed on side surfaces of the multilayer inductor. Signal/power conductive traces formed on side surfaces of the multilayer inductor provide signal/power routing between the top magnetic layer signal/power contacts and respective bottom magnetic layer signal/power contacts. The top external conductive pattern accommodates a semiconductor chip in a flip chip configuration.

In accordance with a second embodiment of the multilayer inductor, a bottom magnetic layer includes an external conductive pattern formed on a bottom surface thereof. The bottom external conductive pattern includes signal/power contacts and first and second inductor electrodes. A top external conductive pattern includes signal/power contacts and an inductor electrode contact. Inductor conductive patterns formed on the top surfaces of intermediate magnetic layers disposed between the top and bottom magnetic layers are electrically coupled to each other by means of through holes to form a spiral inductor element. The spiral inductor element is coupled to the first inductor electrode by means of a through hole formed in the bottom magnetic layer and a through hole formed at a first end of the inductor conductive pattern of the intermediate magnetic layer overlaying the bottom magnetic layer. The spiral inductor element is coupled to the second inductor electrode by means of conductive power traces formed on side surfaces of the multilayer inductor. Signal/power conductive traces formed on side surfaces of the multilayer inductor provide signal/power routing between the top magnetic layer signal/power contacts and respective bottom magnetic layer signal/power contacts. The top external conductive pattern accommodates a semiconductor chip in a flip chip configuration.

In accordance with an aspect of the claimed invention, a multilayer inductor comprises a bottom magnetic layer including an external conductive pattern formed on a bottom surface thereof, the external conductive pattern including a plurality of signal/power contacts disposed at edges thereof and first and second inductor electrodes; a top magnetic layer including an external conductive pattern formed on a top surface thereof, the external conductive pattern including a plurality of signal/power contacts disposed at edges thereof and an inductor electrode contact; and a plurality of intermediate magnetic layers stacked between the bottom magnetic layer and the top magnetic layer, each intermediate magnetic layer including a plurality of signal/power contacts disposed at edges thereof and an inductor conductive pattern, each of the plurality of intermediate magnetic layer signal/power contacts electrically coupled to respective top and bottom magnetic layer signal/power contacts to form external signal/power routes between the top magnetic layer external conductive pattern and the bottom magnetic layer external conductive pattern, each of the intermediate magnetic layer inductor conductive patterns coupled to each other to form a spiral inductor element, the spiral inductor element coupled at a first end thereof to the top magnetic layer inductor electrode contact and at a second end thereof to the first inductor electrode, the top magnetic layer inductor electrode contact coupled to the second inductor electrode by an external inductor power route, comprising at least one of the external signal/power routes.

In accordance with another aspect of the claimed invention, method of manufacturing a multilayer inductor comprises the steps of forming external and internal vias in a plurality of magnetic green sheets; printing and curing conductive patterns on the plurality of magnetic green sheets; stacking and pressing the plurality of magnetic green sheets together to form an internal inductor element and external signal/power routes; firing and baking the plurality of stacked and pressed plurality of magnetic green sheets; singulating the plurality of magnetic green sheets to form a plurality of multilayer inductors; and plating external conductive patterns on the plurality of multilayer inductors.

In accordance with yet another aspect of the claimed invention, a multilayer inductor comprises a plurality of magnetic layers stacked one upon the other; a spiral inductor element formed from electrically coupled inductor conductive patterns formed on adjacent ones of the plurality of magnetic layers; and a plurality of electrically conductive signal/power contacts formed on the edges of each of the plurality of magnetic layers, the plurality of electrically conductive signal/power contacts forming external signal/power routes adapted to route signals and power from a top magnetic layer to a bottom magnetic layer when the plurality of magnetic layers are stacked together.

In accordance with a further aspect of the claimed invention, method of manufacturing a multilayer inductor comprises the steps of providing a plurality of magnetic layers; forming internal vias on ones of the plurality of magnetic layers and forming external vias on each of the plurality of magnetic layers; forming conductive patterns on each of the magnetic layers, the conductive patterns including signal/power contacts on the edges thereof and conductive external vias, the conductive patterns formed on ones of the plurality of magnetic layers further comprising an inductor conductive pattern and a conductive internal via; and stacking the plurality of magnetic layers such that the inductor conductive patterns form a spiral inductor element and the signal/power contacts form external signal/power routes.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 3A is a top perspective view of the multilayer inductor of FIG. 1 in a stacked configuration in accordance with the invention;

FIG. 3B is a bottom perspective view of the multilayer inductor of FIG. 1 in the stacked configuration;

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
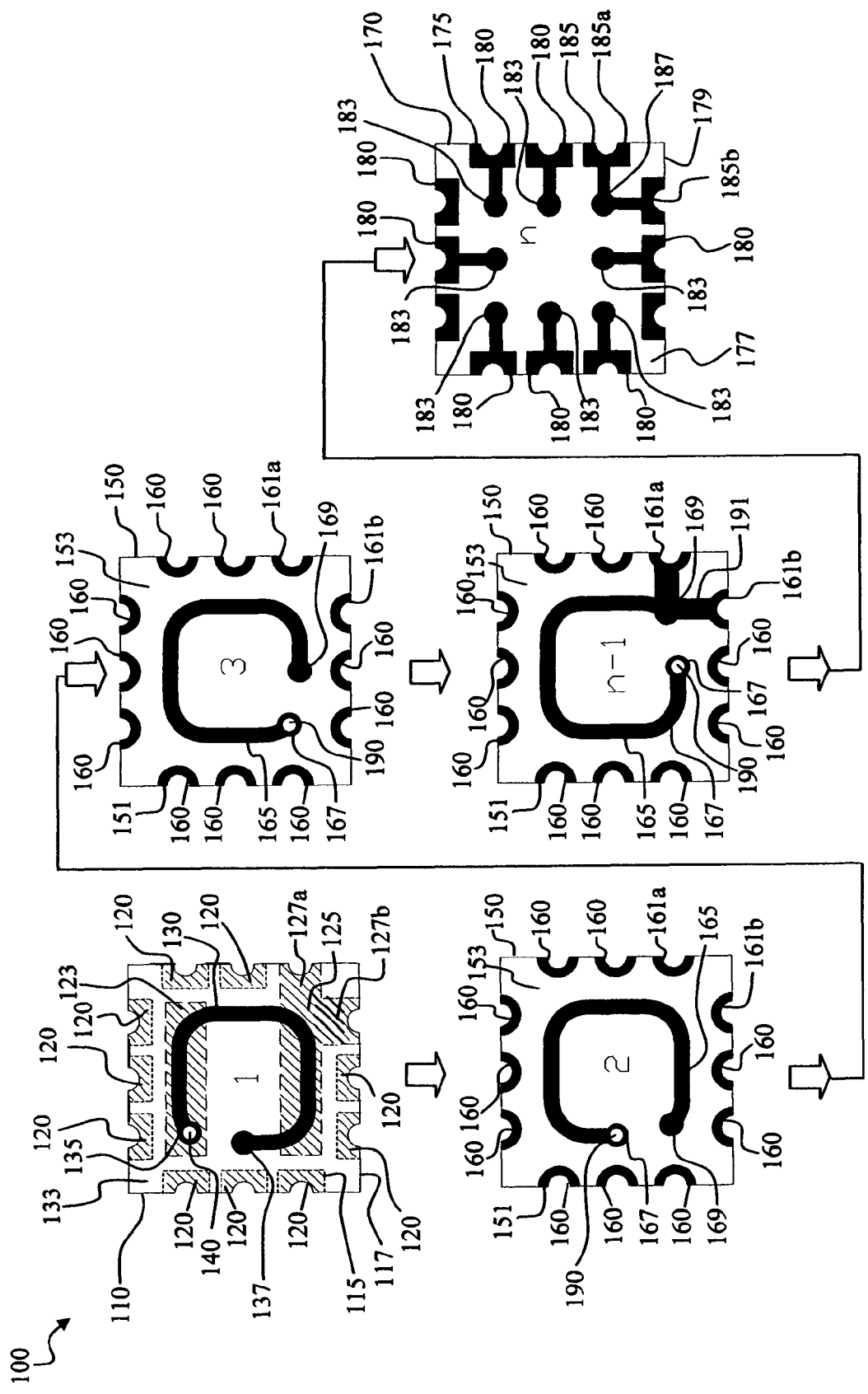
FIG. 1 is a schematic representation of a multilayer inductor in a disassembled configuration in accordance with a first embodiment of the invention.

A first embodiment of a multilayer inductor in accordance with the invention generally designated 100 is shown in FIG. 1. The multilayer inductor 100 includes a plurality n of magnetic layers laminated together including a bottom magnetic layer 110 (corresponding to layer 1), a top magnetic layer 170 (corresponding to layer n), and intermediate magnetic layers 150 (corresponding to layers 2 through n−1). The bottom magnetic layer 110 includes a bottom external conductive pattern 115 (shown in phantom lines and having a cross-hatch fill pattern) formed on a bottom surface 117 thereof. The bottom external conductive pattern 115 has a plurality of signal/power contacts 120 formed at the edges thereof. Three such signal/power contacts 120 are disposed on each of first and second adjacent sides of the bottom magnetic layer 110 in spaced relationship one to the other. Two signal/power contacts 120 are disposed on each of third and fourth adjacent sides of the bottom magnetic layer 110 in spaced relationship one to the other. The bottom external conductive pattern 115 also includes a first inductor electrode 123 disposed internally of the edges of the bottom magnetic layer 110 and a second inductor electrode 125, the second inductor electrode 125 having adjacent corner portions 127a and 127b disposed at a corner formed by the third and fourth sides of the bottom magnetic layer 110. The signal/power contacts 120 and the corner portions 127a and 127b of the second inductor electrode 125 have a semi-circular side profile as further described below and have sidewalls coated with a conductive material, e.g. metal, to provide electrical connection thereal ong in a stacked configuration of the multilayer inductor 100.

The bottom magnetic layer 110 further includes an inductor conductive pattern 130 formed on a top surface 133 thereof. The inductor conductive pattern 130 has a first end 135 and tail end 137 and corresponds generally to seven eighths (⅞) of a turn of a spiral inductor element. A through hole 140 is formed in the bottom magnetic layer 110 and is disposed at the first end 135 of the inductor conductive pattern 130. At least the sidewalls of the through hole 140 are coated with a conductive material, e.g., metal, which provides electrical connection between the first end 135 of the inductor conductive pattern 130 and the first inductor electrode 123, a portion of which is disposed in underlying relationship to the first end 135. Such connection may be provided during printing of the bottom external conductive pattern 115 and inductor conductive pattern 130.

The top magnetic layer 170 includes a top external conductive pattern 175 formed on a top surface 177 thereof. The top external conductive pattern 175 includes a plurality of signal/power contacts 180 formed at the edges thereof. Three signal/power contacts 180 are disposed on each of first and second adjacent sides of the top magnetic layer 170 in spaced relationship one to the other. Two signal/power contacts 180 are disposed on each of third and fourth sides of the top magnetic layer 170 in spaced relationship one to the other. An inductor electrode contact 185 includes adjacent corner portions 185a and 185b formed at a corner formed by the third and fourth sides of the top magnetic layer 170. Ones of the signal/power contacts 180 further include internally disposed contacts 183 electrically coupled to the signal/power contacts 180. An internally disposed contact 187 is electrically coupled to the inductor electrode contact 185. The signal/power contacts 180 and the inductor electrode contact corner portions 185a and 185b have a semi-circular side profile consistent with the side profiles of the signal/power contacts 120 and the inductor electrode contact corner portions 127a and 127b of the second inductor electrode 125 as further described below and have sidewalls coated with a conductive material, e.g. metal, to provide electrical connection thereal ong in the stacked configuration of the multilayer inductor 100.

Intermediate magnetic layers 150 each include a conductive pattern 151 formed on a top surface 153 thereof. Each conductive pattern 151 includes a plurality of signal/power contacts 160 and two adjacent inductor electrode contact corner portions 161a and 161b formed at a corner thereof. Three signal/power contacts 160 are disposed on each of first and second adjacent sides of the intermediate magnetic layers 150 in spaced relationship one to the other. Two signal/power contacts 160 are disposed on each of third and fourth sides of the intermediate magnetic layers 150 in spaced relationship one to the other. Inductor electrode contact corner portions 161a and 161b are formed at a corner formed by the third and fourth sides of the intermediate magnetic layers 150. The signal/power contacts 160 and the inductor electrode contact corner portions 161a and 161b have a semi-circular side profile consistent with the side profiles of the signal/power contacts 120 and 180 and the inductor electrode contact corner portions 127a and 127b of the second inductor electrode 125 and the inductor electrode contact corner portions 185a and 185b as further described below. The signal/power contacts 160 and the inductor electrode contact corner portions 161a and 161b have sidewalls coated with a conductive material, e.g. metal, to provide electrical connection therealong in the stacked configuration of the multilayer inductor 100.

Each conductive pattern 151 further includes an inductor conductive pattern 165 having a first end 167 and tail end 169. Each inductor conductive pattern 165 corresponds generally to seven eighths (⅞) of a turn of the spiral inductor element and is disposed upon each intermediate magnetic layer 150 such that in a stacked configuration, the first end 167 thereof is vertically aligned with the tail end 169 (137 in the case of bottom magnetic layer 110) of an underlying magnetic layer. A through hole 190 formed in each of the first ends 167 provides electrical connection between the first end 167 and the tail end 169 (tail end 137 in the case of the bottom magnetic layer 110) of an underlying magnetic layer in the stacked configuration. The sidewalls of through holes 190 are coated with a conductive material, e.g., metal, in order to provide such electrical connection.

The intermediate magnetic layer 150 underlying the top magnetic layer 170 (layer n−1) includes a trace 191 electrically connecting the tail end 169 of the inductor conductive pattern 165 to the inductor electrode contact corner portions 161a and 161b. Inductor electrode contact corner portions 161a and 161b are in turn electrically connected to the inductor electrode contact portions 185a and 185b formed on the top magnetic layer 170 and to the second inductor electrode 125 on the bottom surface 117 of the bottom magnetic layer 110 as further described below.

In accordance with the first embodiment of the invention, in order that the tail end 169 of inductor conductive pattern 165 of the intermediate magnetic layer 150 underlying the top magnetic layer 170 (layer n−1) be disposed in the position shown in FIG. 1, the number n must be 5+m8 (where m=0, 1, 2, . . . ). In the case where n=5, the number of turns in the spiral inductor element is equal to 3.5. In the case where n=13, the number of turns in the spiral inductor element is equal to 10.5 and so on. The number of magnetic layers (and thus the number of turns in the spiral inductor element) comprising the multilayer inductor 100 is determined by multiple factors such as the inductance desired, the thickness of each magnetic layer, the overall thickness required and the flux density of the multilayer inductor. One skilled in the art will recognize that the tail end 169 of the inductor conductive pattern 165 of the intermediate magnetic layer 150 underlying the top magnetic layer 170 (layer n−1) may be disposed in a different position with appropriate modification to the conductive patterns of the other magnetic layers so as to create a multilayer inductor having desired properties. Furthermore, the length and shape of the inductor conductive patterns 130 and 165 and the shape and location of the first inductor electrode 123 and the second inductor electrode 125, as well as the number of turns and the number of magnetic layers may be modified to achieve desired properties. Selection of inductor conductive patterns 130 and 165 having seven eighths (⅞) of a turn of the spiral inductor element achieves more turns for a given number of magnetic layers but other fractions are within the scope of the invention to meet various combinations of inductance and saturation requirements.

Figure 2B:
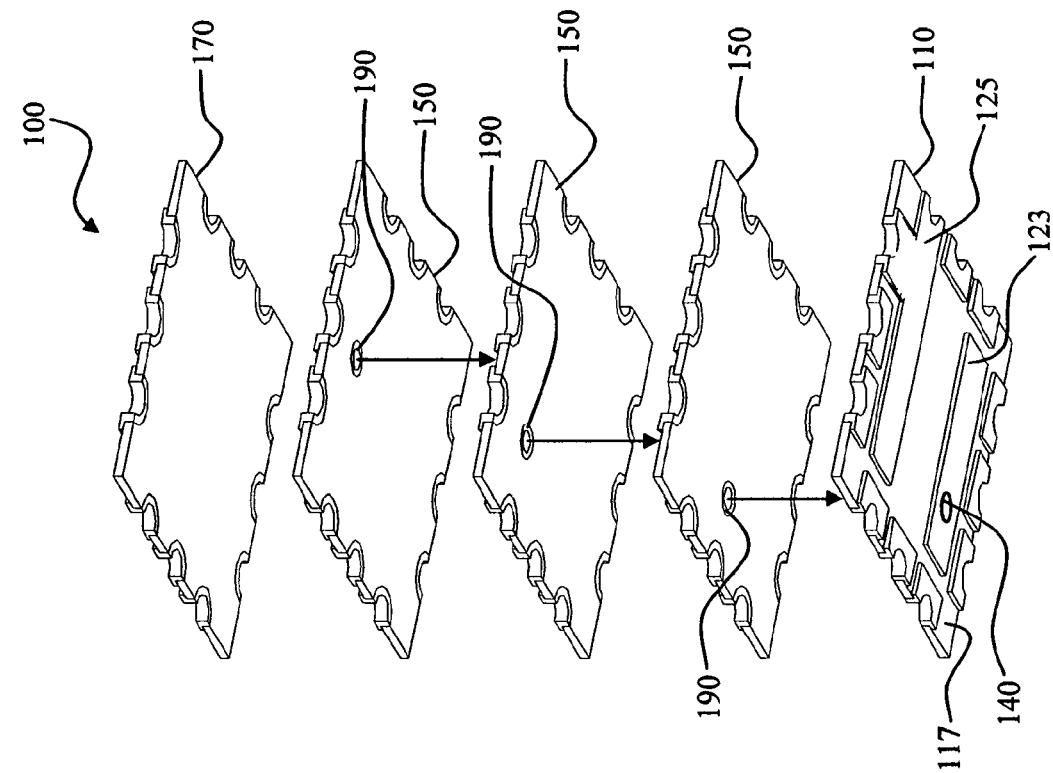
FIG. 2B is a bottom perspective view of the multilayer inductor of FIG. 1 in the disassembled configuration.
Figure 2A:
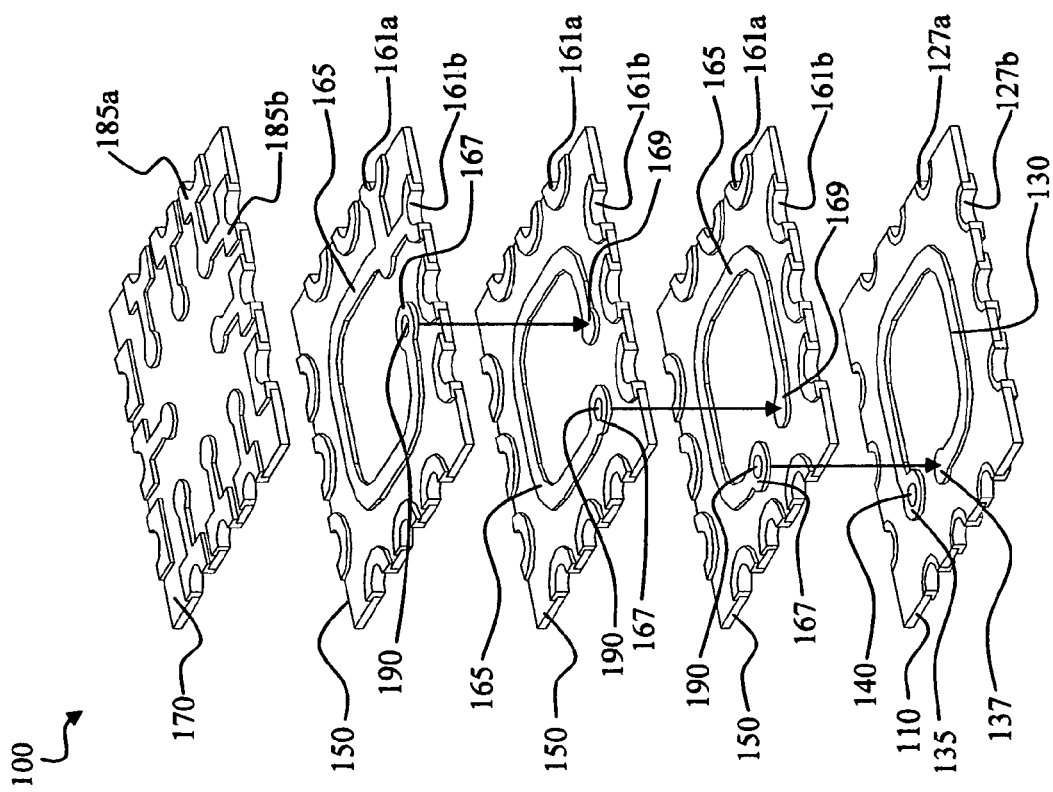
FIG. 2A is a top perspective view of the multilayer inductor of FIG. 1 in the disassembled configuration.

The bottom magnetic layer 110, the intermediate magnetic layers 150 and top magnetic layer 170 are stacked one upon the other vertically as shown in FIGS. 2A and 2B. FIG. 2A is a perspective view showing the top sides of the bottom magnetic layer 110, the intermediate magnetic layers 150, and the top magnetic layer 170 and FIG. 2B is a perspective view showing the bottom sides thereof. Three intermediate magnetic layers 150 are shown. The intermediate magnetic layer 150 overlaying the bottom magnetic layer 110 is shown disposed such that the through hole 190 formed at the first end 167 of the inductor conductive pattern 165 thereof overlays the tail end 137 of the inductor conductive pattern 130 of the bottom magnetic layer 110. Each successive intermediate magnetic layer 150 is similarly disposed such that the through hole 190 formed at the first end 167 of the inductor conductive pattern 165 thereof overlays the tail end 169 of the inductor conductive pattern 165 of the underlying intermediate magnetic layer 150.

The intermediate magnetic layer 150 underlying the top magnetic layer 170 is disposed such that the inductor electrode contact corner portions 185a and 185b formed on the top magnetic layer 170 are disposed directly above the inductor electrode contact corner portions 161a and 161b thereof. Each intermediate magnetic layer 150 is disposed such that the inductor electrode contact corner portions 161a and 161b thereof are disposed directly above the inductor electrode contact corner portions 161a and 161b of the underlying magnetic layer. The intermediate magnetic layer 150 overlaying the bottom magnetic layer 110 is disposed such that the inductor electrode contact corner portions 161a and 161b thereof are disposed directly above the inductor electrode contact corner portions 127a and 127b of the second inductor electrode 125. The inductor electrode contact corner portions 161a and 161b are basically the same as the signal/power contacts 160, except that inductor electrode contact corner portions 161a and 161b are designated for carrying the inductor current. In the stacked configuration, the signal/power contacts 120, 160 and 180 of the bottom magnetic layer 110, the intermediate magnetic layers 150 and the top magnetic layer 170 respectively are aligned such that each signal/power contact is disposed directly above an underlying signal/power contact and electrically coupled thereto to thereby provide vertical conduction of signals and power routed therealong. Exemplary power conduction includes an input voltage (Vcc) to a power IC mounted on the top external conductive pattern 175 in a flip chip configuration.

Figure 10:
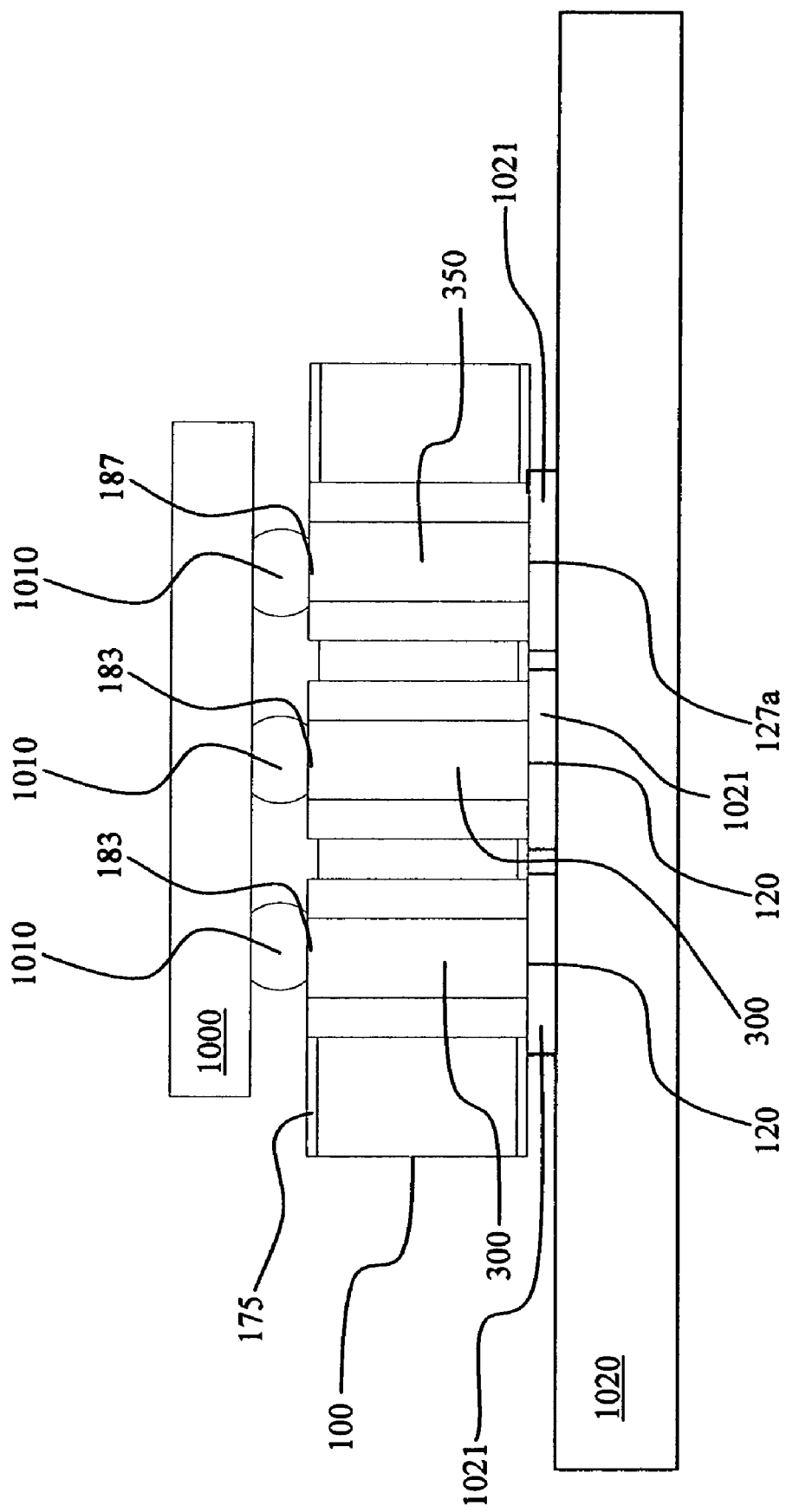
FIG. 10 is a schematic representation of a multilayer inductor having a flip chip mounted on a top external conductive pattern thereof in accordance with the invention.

In accordance with a process of the invention described below, following the formation of the through holes and conductive patterns on the bottom, top and intermediate magnetic layers, the magnetic layers are stacked and laminated together as shown in FIGS. 3A and 3B, to form signal/power routes 300 from signal/power contacts 120, 160 and 180, and to form inductor power routes 350 from inductor electrode contact corner portions 127a, 127b, 161a, 161b, 185a, and 185b. The top and bottom external conductive patterns 175 and 115, the signal/power routes 300 and the inductor power routes 350 are plated following baking of the multilayer inductor 100. By way of example, the plating may be nickel/tin plating. Such plating provides protection and strength to the exposed conductive areas and may further provide for additional conductivity to signal/power routes 300 and inductor power routes 350. Signal/power routes 300 formed along side surfaces of the multilayer inductor 100 electrically connect the signal/power contacts 180 formed on the top magnetic layer 170, the signal/power contacts 160 formed on the intermediate magnetic layers 150 and the signal/power contacts 120 formed on the bottom magnetic layer 110. Inductor power routes 350 formed along side surfaces of the multilayer inductor 100 electrically connect the inductor electrode contact corner portions 185a and 185b formed on the top magnetic layer 170, the inductor electrode contact corner portions 161a and 161b formed on the intermediate magnetic layers 150, and the second inductor electrode corner portions 127a and 127b formed on the bottom magnetic layer 110. In this manner, a chip mounted on the multilayer inductor 100 may be electrically connected to the spiral inductor element at contact 187 with the inductor current also routed to the second electrode 125 by the inductor power routes 350. In a preferred embodiment, the chip is a flip chip power integrated circuit. In another preferred embodiment, the chip may be a regular power integrated circuit that requires wire bonding interconnection. Signal and power inputs and outputs from the flip chip electrically connected to any of the contacts 183 on the top surface 177 of the multilayer inductor are routed to respective signal/power contacts 120 on the bottom surface 117 of the multilayer inductor 100 by means of respective signal/power routes 300. Alternatively, a chip may be connected to contacts 183 on the top surface 177 of the multilayer inductor through wire bonding. Thus a chip may be mounted on the multilayer inductor 100 and have electrical connections to a printed circuit board (as shown in FIG. 10) along the sides of the multilayer inductor 100.

As will be appreciated by one skilled in the art, there is a great deal of flexibility in the design of the multilayer inductor 100 of the invention. For example, the shape and size of the spiral inductor element (the shape and size of each turn, the number of turns, the number of layers, etc.) may be adjusted according to design needs. The magnetic layers may be of different shapes. The number of signal/power routes 300 and inductor power routes 350 may also be adjusted. In FIG. 3A, only some of the signal/power routes 300 are used, but the allocation of the signal/power routes 300 may be easily adjusted by modifying the top external conductive pattern 175. The location and number of inductor power routes 350 can also be easily modified. If required, a second inductor contact can be added to the top surface 177 of the top magnetic layer 170. The inductor power routes 350 are basically ones of the signal/power routes 300 designated and connected to be used for carrying the inductor current.

Figure 4:
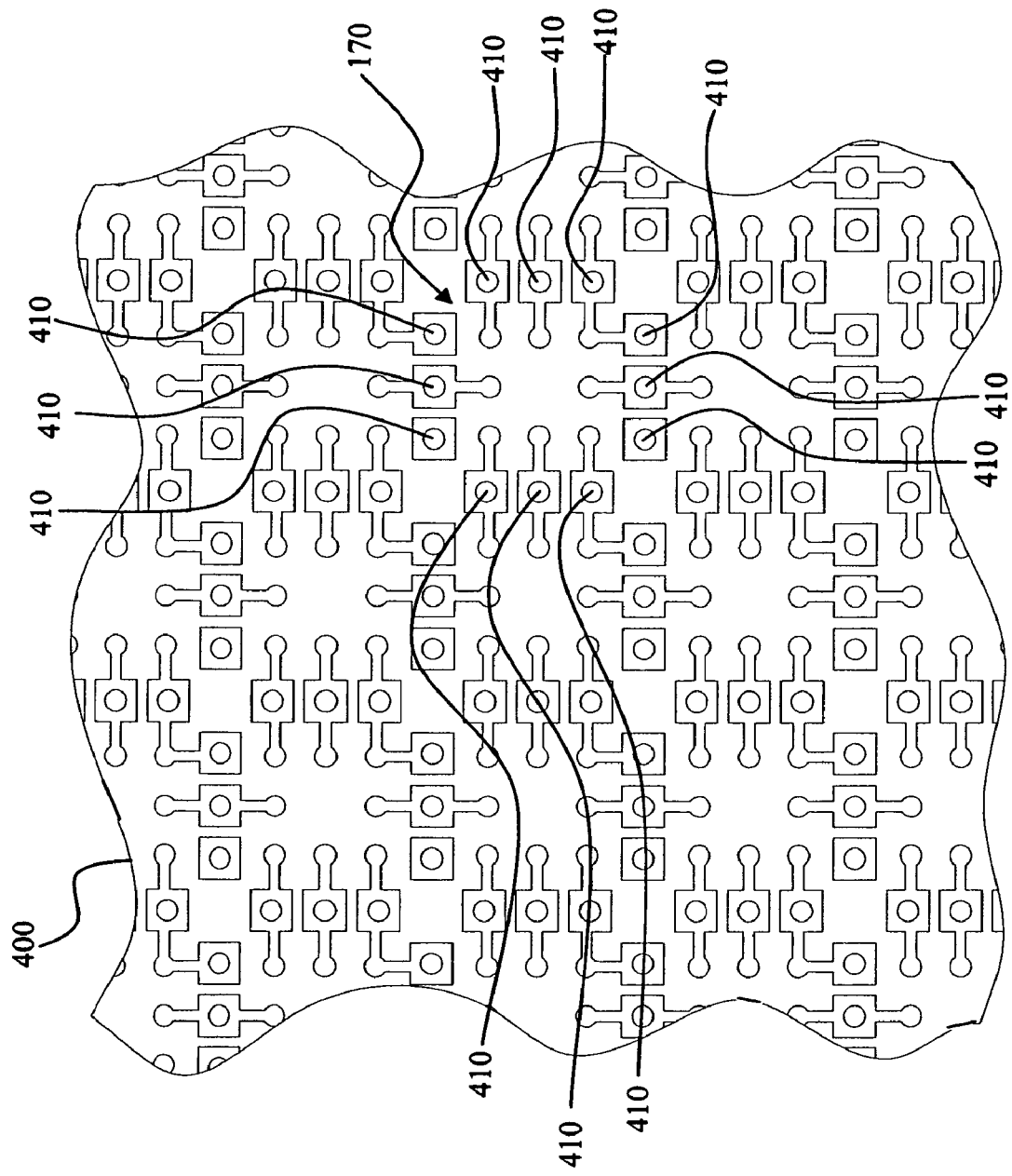
FIG. 4 is a top plan view of partial green sheet laminates in accordance with the invention.
Figure 5:
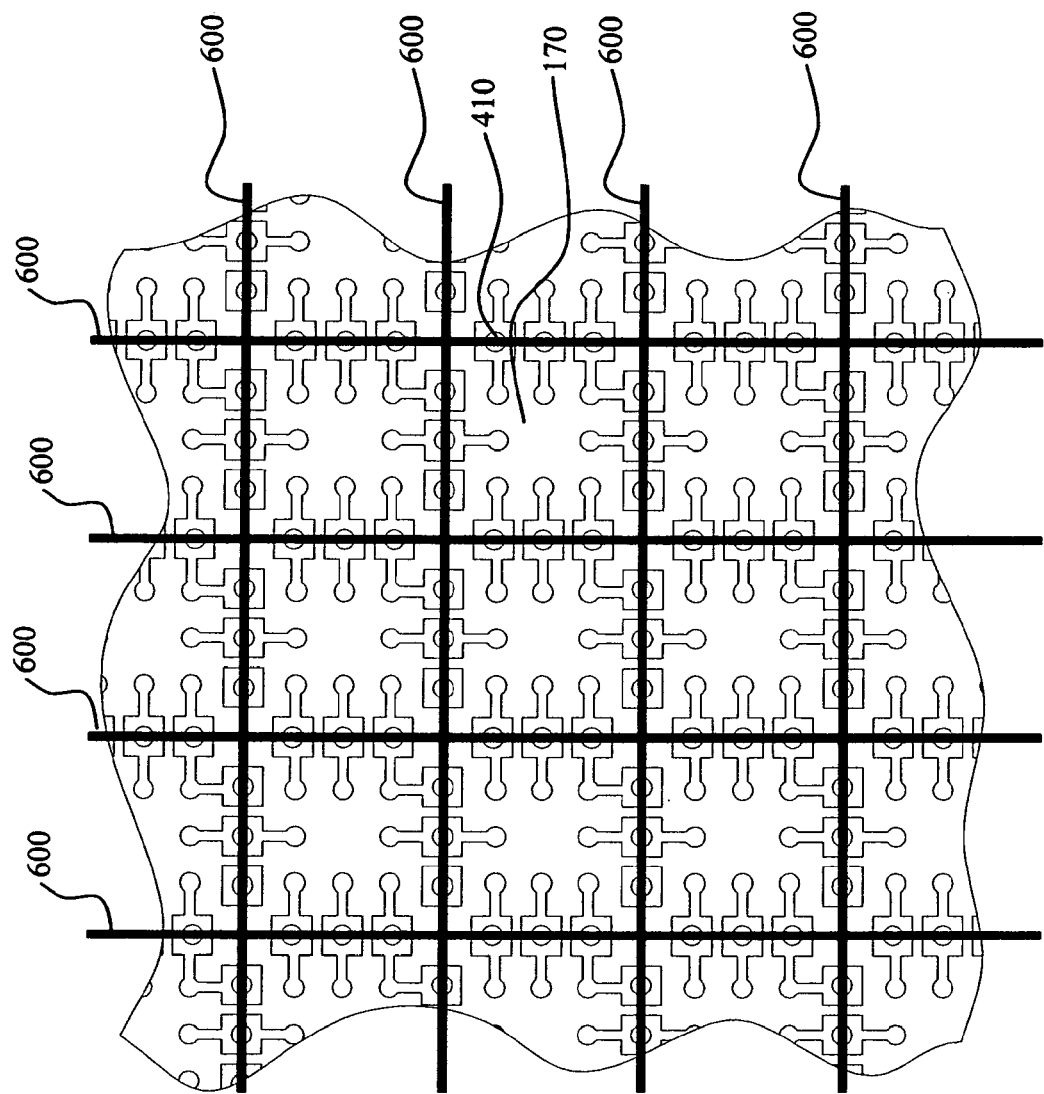
FIG. 5 is a top plan view of the partial green sheet laminates of FIG. 4 showing saw lines in accordance with the invention.

The magnetic layers in accordance with the invention are preferably formed from magnetic green sheets. Magnetic green sheets are made by applying a slurry of magnetic ceramic material to a supporting film. After the magnetic ceramic material dries, the supporting film is stripped to yield the green sheet. The thickness of each green sheet can be as thin as 50 microns such that a multilayer inductor formed therefrom has a low profile. Each green sheet may contain a plurality of unit layers that are used as a particular layer in a plurality of multilayer inductors. For example, a green sheet 400 (shown partially in FIG. 4) includes a plurality of rectangular unit magnetic layers 170 (FIGS. 5 and 6) formed after singulation along saw lines 600 (FIG. 5).

Figure 6:
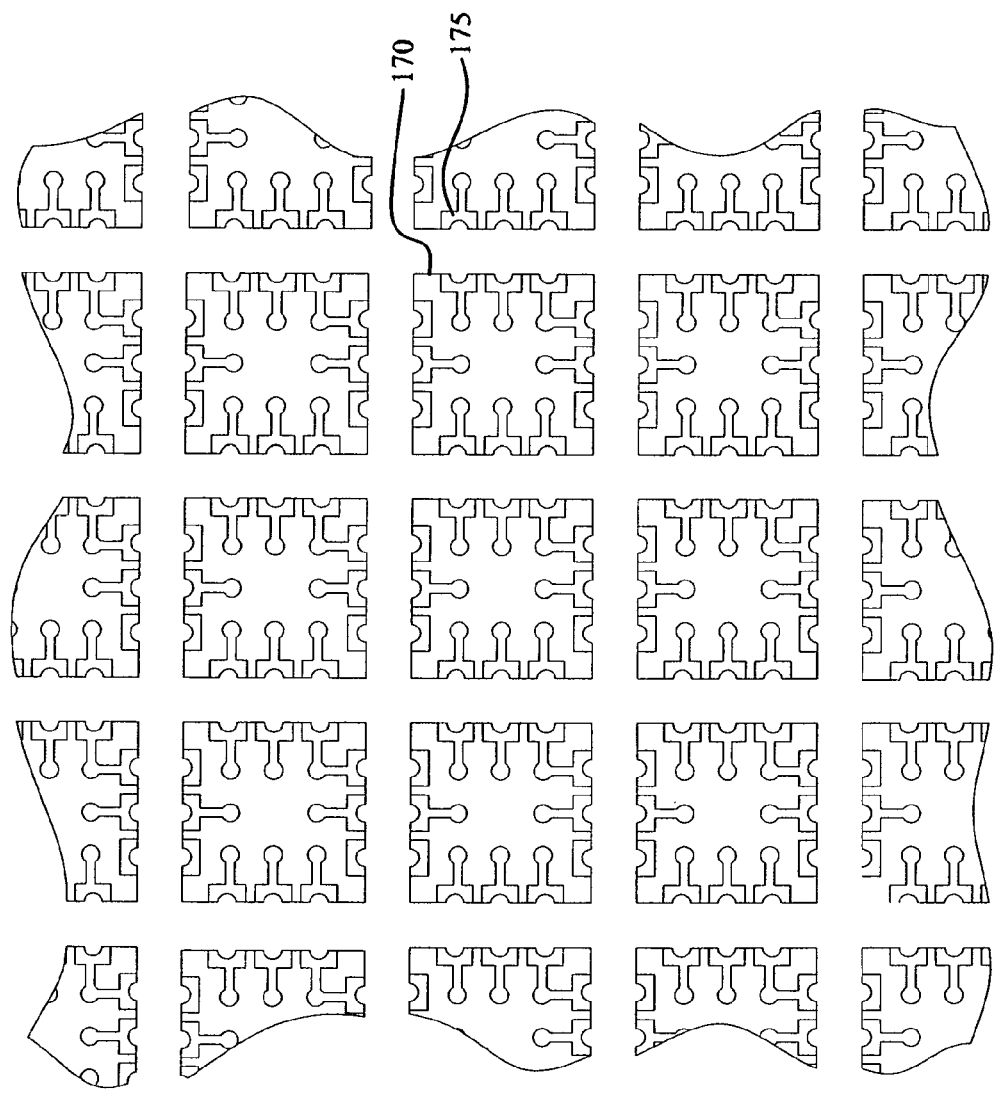
FIG. 6 is a top plan view of the partial green sheet laminates of FIG. 5 following singulation in accordance with the invention.
Figure 7:
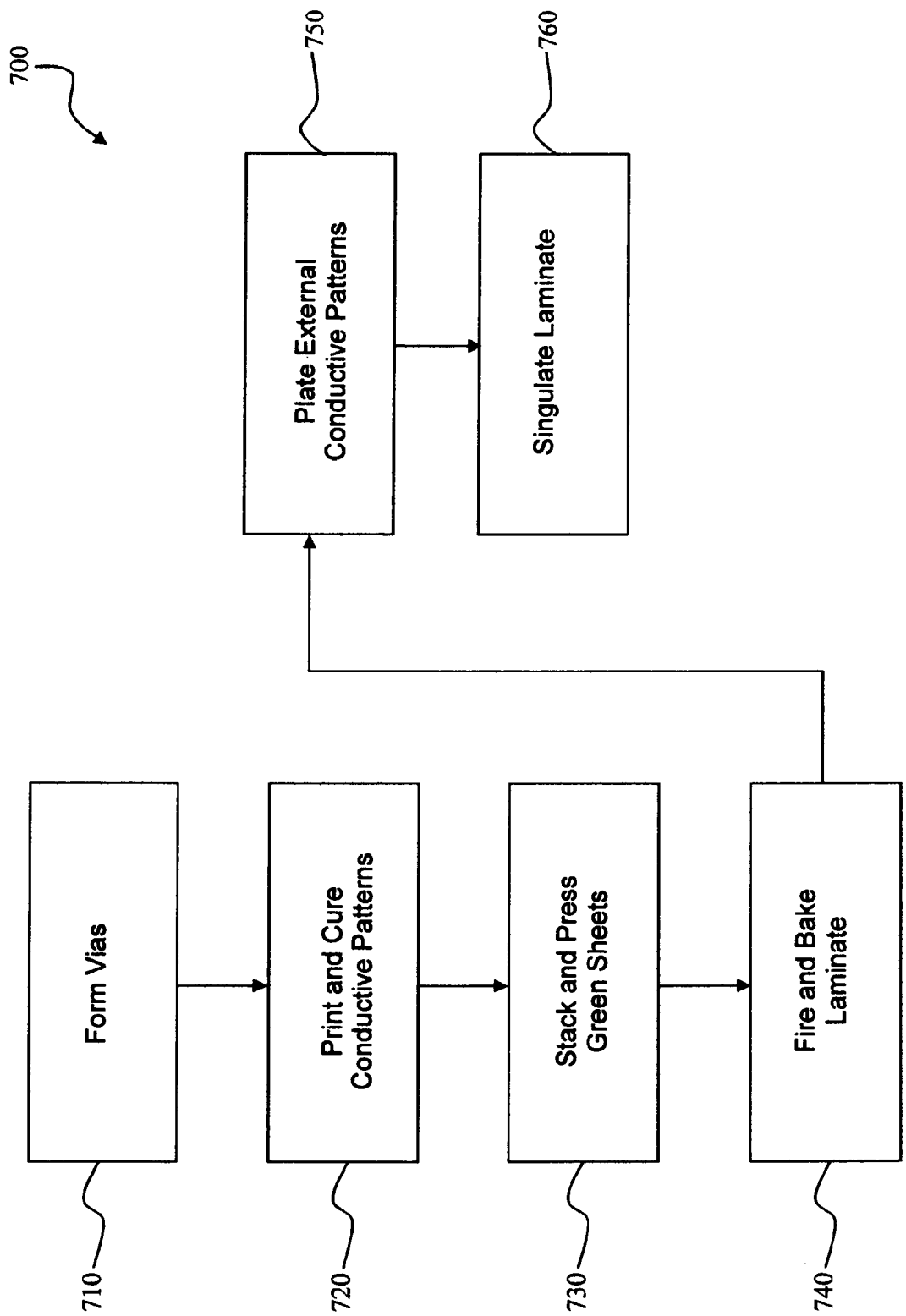
FIG. 7 is a flow chart of a multilayer inductor manufacturing process in accordance with the invention.

A process 700 of manufacturing multilayer inductors in accordance with the invention is shown in FIG. 7. FIGS. 4-6 are top views illustrating some of the steps of the process 700 using top magnetic layers 170 as an example. In a step 710 through holes or vias are formed at specific locations of the green sheets 400. The specific locations are dependent upon the particular layer for which the green sheet will be employed. For example, through holes 410 are formed in the green sheet 400 to provide the semi-circular side profile to the signal/power contacts 180 and the inductor electrode contact corner portions 185a and 185b of each top magnetic layer 170 following singulation. Through holes 410 are designated external vias. Internal vias are also formed in the step 710. Exemplary internal vias include through holes 140 and 190 (FIG. 1). Through holes 410, 140 and 190 may be formed by conventional processes including drilling, punching, etching and laser cutting and preferably have a dimension between 30 and 500 microns. The shapes of the through holes 410, 140 and 190 can also be other than circular including oval or rectangular shapes. Alternatively, the external vias may be formed following the stacking step described below though the external vias so formed would be difficult to coat with conductive material at that stage since the vias would be so deep.

Following the via formation step 710, in a step 720 conductive patterns 151 are printed and cured on the green sheets comprising intermediate magnetic layers 150, top external conductive patterns 175 are printed and cured on the green sheets comprising top magnetic layers 170, and bottom external conductive patterns 115 and the inductor conductive pattern 130 (if applicable) are printed and cured on the green sheets comprising bottom magnetic layers 110. While printing the conductive patterns 115, 175, 151 and 130, the sidewalls of the external vias 410 and of the through holes 140 and 190 are also covered with the conductive paste. The conductive paste may include silver or other oxidation-proof metal particles.

In a step 730, the green sheets are stacked in order one atop the other and laminated and pressed to form the spiral inductor elements. Through holes 190 provide electrical connection between inductor conductive patterns 165 and the inductor conductive pattern 130 formed on the bottom magnetic layer 110 as previously described. Following the step 730, in a step 740 the resulting laminate is fired and the conductive paste forming the conductive patterns 151 and the inductor conductive pattern 130 is baked. The baking and firing may be performed together, or separately.

The top and bottom external conductive patterns 175 and 115, the signal/power routes 300 and the inductor power routes 350 are next plated with metal in a step 750. The laminated magnetic green sheets are then singulated into individual multilayer inductors 100 in a step 760. After the singulation step 760, the halved external vias 410 provide the side profile of the contacts. Alternatively, the plating step 750 may occur after the singulation step 760 in order to better plate the external power/signal routes 300 and inductor power routes 350. Furthermore, the top and bottom conductive patterns may be printed after the stacking and pressing step 730. This may avoid potential damage to the conductive patterns on the top and bottom surfaces during the stacking and pressing step 730. By way of example, the plating step 750 may be performed using nickel (Ni) and/or Tin (Sn). The plating improves the durability of the exposed conductive patterns and reduces parasitic resistance.

As will be appreciated by one skilled in the art, there are many possible variations to the method 700. The most essential steps in forming the multilayer inductor of the invention are: a) forming internal and external vias on magnetic material layers; b) forming conductive patterns on the magnetic layers to provide for the spiral inductor element; and c) stacking the magnetic layers to form the spiral inductor element and the external electrical routes. In the above steps, step b) may include forming inductor conductive patterns, signal/power contacts, inductor power contacts, and external conductive patterns.

Figure 8:
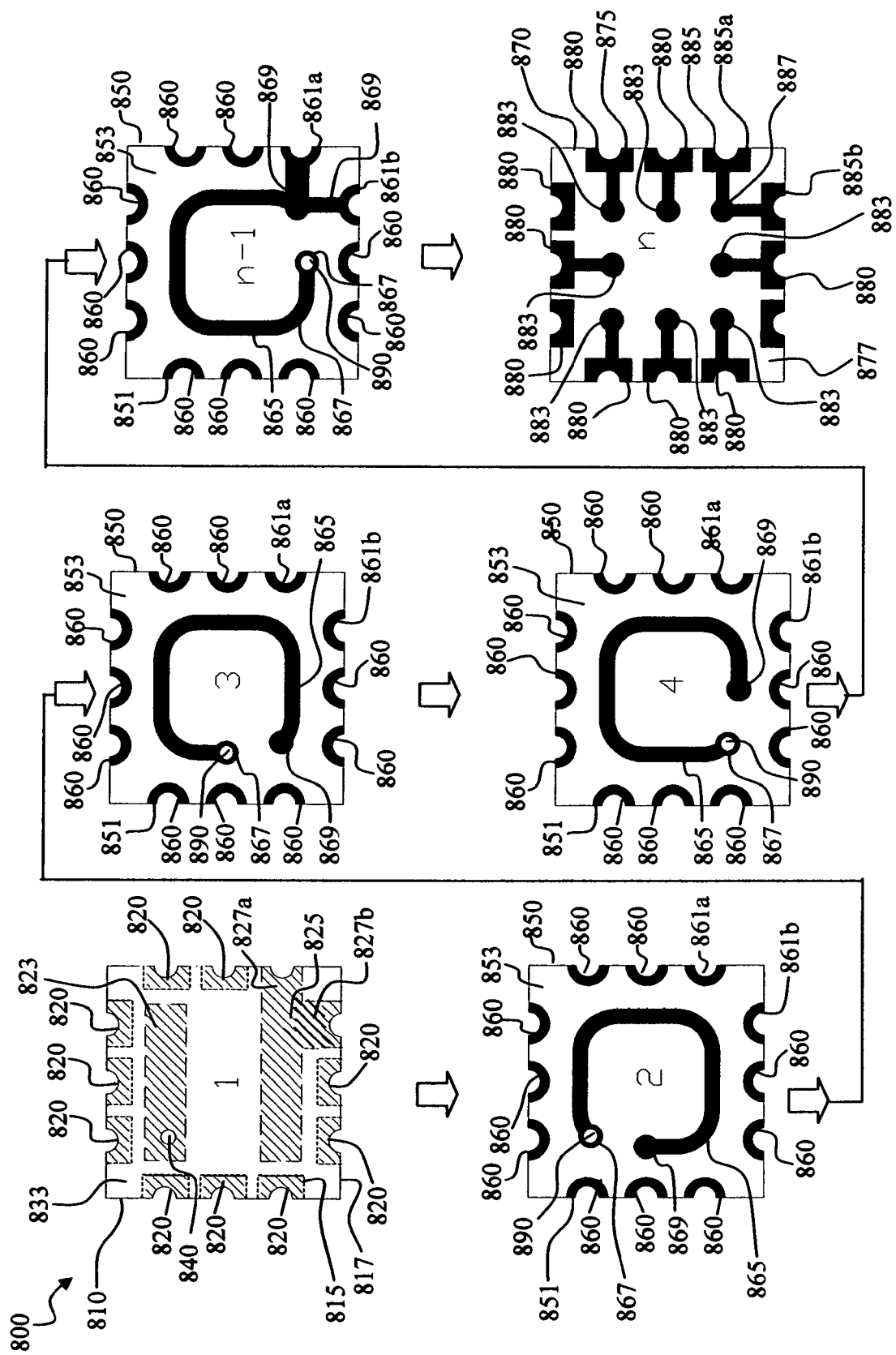
FIG. 8 is a schematic representation of a multilayer inductor in a disassembled configuration in accordance with a second embodiment of the invention.

A second embodiment of a multilayer inductor in accordance with the invention generally designated 800 is shown in FIG. 8. The multilayer inductor 800 includes a plurality n of magnetic layers laminated together including a bottom magnetic layer 810 (corresponding to layer 1), a top magnetic layer 870 (corresponding to layer n), and intermediate magnetic layers 850 (corresponding to layers 2 through n–1). In contrast to the bottom magnetic layer 110 of the multilayer inductor 100, the bottom magnetic layer 810 does not have an inductor conductive pattern formed on a top surface 833 thereof. This may simplify the manufacturing process since only one side of the bottom magnetic layer 810 needs to have a conductive pattern formed thereon.

The bottom magnetic layer 810 includes a bottom external conductive pattern 815 (shown in phantom lines and having a cross-hatch fill pattern) formed on a bottom surface 817 thereof. The bottom external conductive pattern 815 has a plurality of signal/power contacts 820 formed at the edges thereof. Three such signal/power contacts 820 are disposed on each of first and second adjacent sides of the bottom magnetic layer 810 in spaced relationship one to the other. Two signal/power contacts 820 are disposed on each of third and fourth adjacent sides of the bottom magnetic layer 810 in spaced relationship one to the other. The bottom external conductive pattern 815 also includes a first inductor electrode 823 disposed internally of the edges of the bottom magnetic layer 810 and a second inductor electrode 825, the second inductor electrode 825 having adjacent corner portions 827a and 827b disposed at a corner formed by the third and fourth sides of the bottom magnetic layer 810. The signal/power contacts 820 and the corner portions 827a and 827b of the second inductor electrode 825 have a semi-circular side profile as described above with reference to signal/power contacts 120 and the inductor electrode contact corner portions 127a and 127b of the second inductor electrode 125 (FIG. 1). The sidewalls of the signal/power contacts 820 and the inductor electrode contact corner portions 827a and 827b are coated with electrically conductive material as in the first embodiment of the invention.

A through hole 840 formed in the bottom magnetic layer 810 provides electrical connection between the first inductor electrode 823 and a conductive pattern formed on the intermediate magnetic layer 850 overlaying the bottom magnetic layer 810 as further described below. The sidewall of the through hole 840 is coated with electrically conductive material as in the first embodiment of the invention.

The top magnetic layer 870 includes a top external conductive pattern 875 formed on a top surface 877 thereof. The top external conductive pattern 875 includes a plurality of signal/power contacts 880 formed at the edges thereof. Three signal/power contacts 880 are disposed on each of first and second adjacent sides of the top magnetic layer 870 in spaced relationship one to the other. Two signal/power contacts 880 are disposed on each of third and fourth sides of the top magnetic layer 870 in spaced relationship one to the other. An inductor electrode contact 885 includes adjacent corner portions 885a and 885b formed at a corner of the third and fourth sides of the top magnetic layer 870. Ones of the signal/power contacts 880 further include internally disposed contacts 883 electrically coupled to the signal/power contacts 880. An internally disposed contact 887 is electrically coupled to the inductor electrode contact 885. The signal/power contacts 880 and the inductor electrode contact corner portions 885a and 885b have a semi-circular side profile consistent with the side profiles of the signal/power contacts 820 and the inductor electrode contact corner portions 827a and 827b of the second inductor electrode 825.

Intermediate magnetic layers 850 each include a conductive pattern 851 formed on a top surface 853 thereof. Each conductive pattern 851 includes a plurality of signal/power contacts 860 and two adjacent inductor electrode contact corner portions 861a and 861b formed at the edges thereof. Three signal/power contacts 860 are disposed on each of first and second adjacent sides of the intermediate magnetic layers 850 in spaced relationship one to the other. Two signal/power contacts 860 are disposed on each of third and fourth sides of the intermediate magnetic layers 850 in spaced relationship one to the other. Inductor electrode contact corner portions 861a and 861b are formed at a corner formed by the third and fourth sides of the intermediate magnetic layers 850. The signal/power contacts 860 and the inductor electrode contact corner portions 861a and 861b have a semi-circular side profile consistent with the side profiles of the signal/power contacts 820 and 880 and the corner portions 827a and 827b of the second inductor electrode 825 and the inductor electrode contact corner portions 885a and 885b.

Each conductive pattern 851 further includes an inductor conductive pattern 865 having a first end 867 and tail end 869. Each inductor conductive pattern 865 corresponds generally to seven eighths (⅞) of a turn of the spiral inductor element and is disposed upon each intermediate magnetic layer 850 such that in a stacked configuration, the first end 867 thereof is vertically aligned with the tail end 869 of an underlying inductor conductive pattern 865. A through hole 890 formed in each of the first ends 867 provides electrical connection between the first ends 867 of each intermediate magnetic layer 850 and the tail ends 869 of the underlying magnetic layer in the stacked configuration. The through hole 890 of the intermediate magnetic layer 850 overlaying the bottom magnetic layer 810 provides electrical connection between first end 867, the through hole 840 and first inductor electrode 823 of the bottom magnetic layer 810.

The intermediate magnetic layer 850 underlying the top magnetic layer 870 (layer n–1) includes a trace 891 electrically connecting the tail end 869 of the inductor conductive pattern 865 to the inductor electrode contact corner portions 861a and 861b. Inductor electrode contact corner portions 861a and 861b are in turn electrically connected to the inductor electrode contact corner portions 885a and 885b formed on the top magnetic layer 870 as previously described with reference to the first embodiment.

In accordance with the second embodiment of the invention, in order that the tail end 869 of the inductor conductive pattern 865 of the intermediate magnetic layer 850 underlying the top magnetic layer 870 be disposed in the position shown in FIG. 8, the number n must be 6+m8 (where m=0, 1, 2, . . . ). In the case where n=6, the number of turns in the spiral inductor element is equal to 3.5. In the case where n=14, the number of turns in the spiral inductor element is equal to 10.5 and so on. The number of magnetic layers (and thus the number of turns in the spiral inductor element) comprising the multilayer inductor 800 is determined by multiple factors such as the inductance desired, the thickness of each magnetic layer, the overall thickness required and the flux density of the multilayer inductor. One skilled in the art will recognize that the tail end 869 of the inductor conductive pattern 865 of the intermediate magnetic layer 850 underlying the top magnetic layer 870 may be disposed in a different position with appropriate modification to the conductive patterns of the other magnetic layers so as to create a multilayer inductor having desired properties. Furthermore, the length and shape of the inductor conductive patterns 865 and the shape and location of the first inductor electrode 823 and the second inductor electrode 825 may be modified to achieve desired properties. Selection of inductor conductive patterns 865 having seven eighths (⅞) of a turn of the spiral inductor element achieves more turns for a given number of magnetic layers but other fractions are within the scope of the invention to meet various combinations of inductance and saturation requirements.

The bottom magnetic layer 810, the intermediate magnetic layers 850 and top magnetic layer 870 are stacked one upon the other vertically as described with reference to the first embodiment. The intermediate magnetic layer 850 overlaying the bottom magnetic layer 810 is disposed such that the through hole 890 formed at the first end 867 of the inductor conductive pattern 865 thereof overlays the through hole 840 formed through the first electrode 823. Each successive intermediate magnetic layer 850 is disposed such that the through hole 890 formed at the first end 867 of the inductor conductive pattern 865 thereof overlays the tail end 869 of the inductor conductive pattern 865 of the underlying intermediate magnetic layer 850.

The intermediate magnetic layer 850 underlying the top magnetic layer 870 is disposed such that the inductor electrode contact corner portions 885a and 885b formed on the top magnetic layer 870 are disposed directly above the inductor electrode contact corner portions 861a and 861b thereof. Each successive intermediate magnetic layer 850 is disposed such that the inductor electrode contact corner portions 861a and 861b thereof are disposed directly above the inductor electrode contact corner portions 861a and 861b of the underlying magnetic layer. The intermediate magnetic layer 850 overlaying the bottom magnetic layer 810 is disposed such that the inductor electrode contact corner portions 861a and 861b thereof are disposed directly above the corner portions 827a and 827b of the second inductor electrode 825. In the stacked configuration, the signal/power contacts 820, 860 and 880 of the bottom magnetic layer 810, the intermediate magnetic layers 850 and the top magnetic layer 870 are aligned such that each signal/power contact is disposed directly above an underlying signal/power contact.

In accordance with a process of the invention described above, following the formation of the vias and conductive patterns on the intermediate magnetic layers, the magnetic layers are stacked and laminated together. The top and bottom external conductive patterns 875 and 815 are then plated. The resulting multilayer inductor 800 includes plated signal/power routes (not shown) formed along side surfaces of the multilayer inductor 800 that include and electrically connect the signal/power contacts 880 formed on the top magnetic layer 870, the signal/power contacts 860 formed on the intermediate magnetic layers 850 and the signal/power contacts 820 formed on the bottom magnetic layer 810. Inductor power routes (not shown) formed along side surfaces of the multilayer inductor 800 electrically connect and include the inductor electrode contact corner portions 885a and 885b formed on the top magnetic layer 870, the inductor electrode contact corner portions 861a and 861b formed on the intermediate magnetic layers 850 and the second electrode contact corner portions 827a and 827b formed on the bottom magnetic layer 810. In this manner, a flip chip mounted on the multilayer inductor 800 may be electrically connected to the spiral inductor element at contact 887 with the inductor current routed to the second electrode 825 by the power routes. Signals and power from the flip chip electrically connected to any of the contacts 883 are routed to respective signal/power contacts 820 by means of respective signal/power routes.

Figure 9:
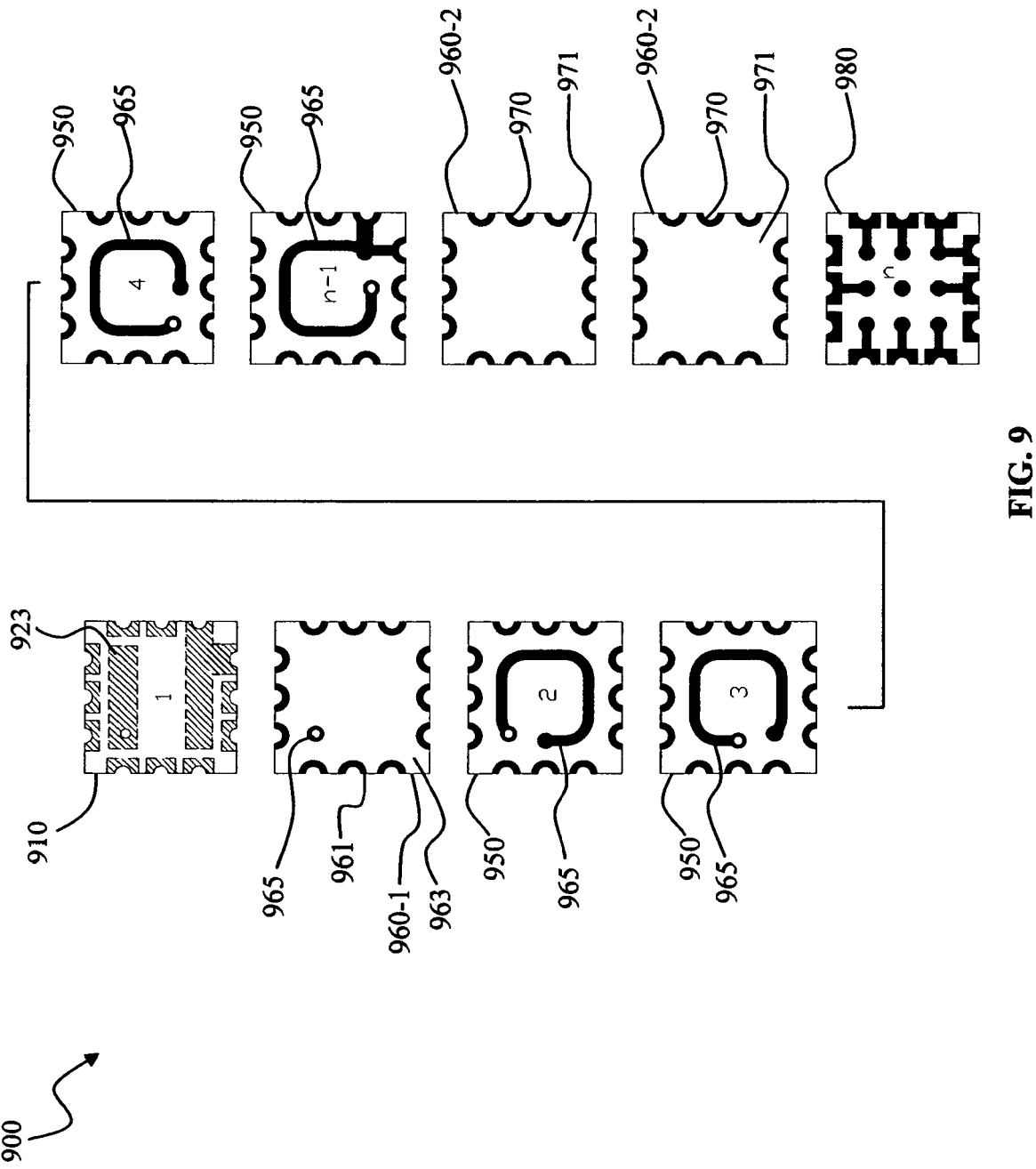
FIG. 9 is a schematic representation of a multilayer inductor in a disassembled configuration in accordance with a third embodiment of the invention.

In order to reduce flux density near the top and bottom of the multilayer inductor of the invention, a single magnetic layer or magnetic layers not having inductor conductive patterns forming part of the spiral inductor element may be positioned adjacent to the top and bottom magnetic layers. These magnetic layers may also help to reduce interference with electrical devices stacked above and/or below the multilayer inductor. With reference to FIG. 9, a third embodiment of the invention includes a multilayer inductor 900 having a plurality of magnetic layers laminated together including a bottom magnetic layer 910, a top magnetic layer 980, intermediate magnetic layers 950 and flux density reducing magnetic layers 960-1 and 960-2. The bottom magnetic layer 910, the top magnetic layer 980 and the intermediate magnetic layers 950 are in all respects identical to the bottom magnetic layer 810, the top magnetic layer 870 and the intermediate magnetic layers 850 respectively of the second embodiment of the invention.

The flux reducing magnetic layer 960-1 is disposed in overlaying relationship to the bottom magnetic layer 910 and includes a conductive pattern 961 formed on a top surface 963 thereof. The conductive pattern 961 includes signal/power contacts and inductor electrode contact portions disposed at the edges thereof to provide signal/power routing and inductor power routing as described with reference to the first and second embodiments of the invention. A through hole 965 formed in the flux reducing magnetic layer 960-1 provides electrical connection between an inductor conductive pattern 965 formed on an intermediate magnetic layer 950 disposed in overlaying relationship to the flux reducing magnetic layer 960 and a first electrode 923 of the bottom magnetic layer 910.

The flux reducing magnetic layers 960-2 (two are shown) are disposed in underlying relationship to the top magnetic layer 980 and include conductive patterns 970 formed on top surfaces 971 thereof. The conductive patterns 970 include signal/power contacts and inductor electrode contact portions disposed at the edges thereof to provide signal/power routing and inductor power routing as described with reference to the first and second embodiments of the invention. One skilled in the art will recognize that the third embodiment can be modified to include more or less flux reducing magnetic layers 960-1 and 960-2 to thereby provide for different flux densities near the top and bottom of the multilayer inductor of the invention.

With reference to FIG. 10, a flip chip 1000 is shown disposed on the top external conductive pattern 175 of the multilayer inductor 100. Electrical connection between contacts of the flip chip 1000 and contacts 183 and 187 of the top external conductive pattern 175 are made by means of solder balls 1010. Signal/power routes 300 and power routes 350 provide signal/power and inductor power routing to signal/power contacts 120 and corner portion 127a of the second electrode 125 that are in turn connected to contacts (not shown) of a printed circuit board (PCB) 1020. The first and second inductor electrodes 123 and 125 may also be connected to contacts (not shown) of the printed circuit board 1020. By way of example, solder paste 1021 may be used to attach the multilayer inductor 100 to the PCB 1020. In a preferred embodiment, the flip chip 1000 may be a power control chip.

Figure 11:
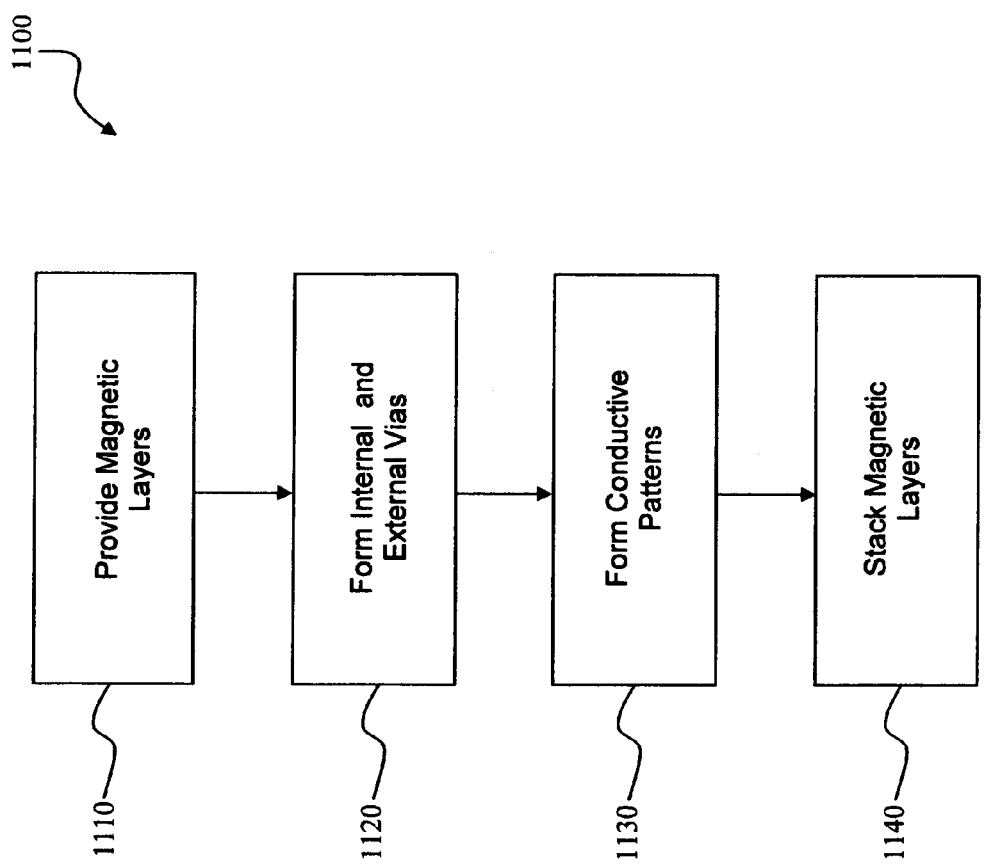
FIG. 11 is a flow chart of a simplified multilayer inductor manufacturing process in accordance with the invention.

FIG. 11 shows a simplified method 1100 for manufacturing a multilayer inductor of the invention. After a step 1110 of providing magnetic layers, in a step 1120, internal vias are formed on ones of the magnetic layers and external vias are formed on each of the magnetic layers. In a step 1130, conductive patterns are formed on each of the magnetic layers.

The conductive patterns may include inductor conductive patterns, signal/power contacts, and patterns on the internal and external vias. In a step 1140, the magnetic layers are stacked such that the inductor conductive patterns form a spiral inductor element and the signal/power contacts form external signal/power routes. The top of the multilayer inductor may be adapted to receive a semiconductor chip such as an integrated circuit (IC) chip, a flip chip, or a power control chip. The bottom of the multilayer inductor may be adapted for mounting on a circuit board. Forming the signal/power contacts may further comprise forming external vias on each of the magnetic layers, forming a conductive pattern on the external vias, and singulating the magnetic layers through the external vias. There may be an additional step of singulating the inductors through the external vias.

The multilayer inductor of the invention provides a cost-effective structure having a relatively small thickness and a compact size that accommodates a semiconductor chip in a flip chip configuration on a top external conductive pattern thereof. Signal/power and inductor power routing is achieved by means of conductive patterns formed on side surfaces of the multilayer inductor that route signals/power and inductor power from the top external conductive pattern to a bottom external conductive pattern. The process of manufacturing the multilayer inductor provides for the formation of the signal/power and inductor power routing conductive patterns concurrently with the formation of inductor conductive patterns to thereby reduce the number of manufacturing steps. In a preferred embodiment, the multilayer inductor of the invention is a power inductor suitable for use with power semiconductors such as power MOSFETs, and power control chips. Although the invention describes the spiral inductor element of the multilayer inductor in great detail, the signal/power and inductor power routing may be applied to any multilayer inductor. Conductive side contacts are formed on each layer of the multilayer inductor such that they form signal/power and inductor power routes when the layers are stacked together.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A method of manufacturing a multilayer inductor comprising the steps of: forming external and internal vias in a plurality of magnetic green sheets; printing and curing conductive patterns on the plurality of magnetic green sheets; stacking and pressing the plurality of magnetic green sheets together to form an internal inductor element and external signal/power routes; firing and baking the plurality of stacked and pressed plurality of magnetic green sheets; singulating the plurality of magnetic green sheets; and plating external conductive patterns on the plurality of multilayer inductors, and further comprising the multi-layer inductor accommodating a semiconductor chip in a flip chip configuration, and wherein each layer of the at least one multi-layer inductor contains $7/8$ turns of conductive trace on one surface except for the top layer.

2. The method of claim 1, wherein the printing and curing conductive patterns on the plurality of magnetic green sheets comprises printing signal/power contacts and inductor conductive patterns with a conductive paste.

3. The method of claim 1, wherein plating external conductive patterns on the plurality of multilayer inductors comprises plating an exposed portion of the signal/routing routes on side surfaces of the plurality of multilayer inductors.

4. A method of manufacturing a multilayer inductor comprising: providing a plurality of magnetic layers; forming internal vias on ones of the plurality of magnetic layers and forming external vias on each of the magnetic layers; forming conductive patterns on each of the magnetic layers, the conductive patterns including signal/power contacts on the edges thereof and conductive external vias, the conductive patterns formed on ones of the plurality of magnetic layers further comprising an inductor conductive pattern and a conductive internal via; and stacking the plurality of magnetic layers such that the inductor conductive patterns form a spiral inductor element and the signal/power contacts form external signal/power routes, and further comprising the multi-layer inductor accommodating a semiconductor chip in a flip chip configuration, and wherein each layer of the multi-layer inductor contains $7/8$ turns of conductive trace on one surface except for a top layer.

5. The method of claim 4, wherein a top surface is adapted to receive a semiconductor device, one of the contacts of the semiconductor device being electrically coupled to one of the external signal/power routes.

6. The method of claim 4, wherein a top surface is adapted to receive a flip chip, one of the contacts of the flip chip being electrically coupled to one of the external signal/power routes.

7. The method of claim 4, further comprising singulating the magnetic layers through the external vias.

* * * * *